United States Patent
Li et al.

(10) Patent No.: US 10,199,576 B2
(45) Date of Patent: Feb. 5, 2019

(54) DISPLAY PANEL AND FABRICATING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fashun Li, Beijing (CN); Fuyi Cui, Beijing (CN); Xuefei Bai, Beijing (CN); Shixin Ruan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/511,288

(22) PCT Filed: Mar. 17, 2016

(86) PCT No.: PCT/CN2016/076591
§ 371 (c)(1),
(2) Date: Mar. 15, 2017

(87) PCT Pub. No.: WO2016/180079
PCT Pub. Date: Nov. 17, 2016

(65) Prior Publication Data
US 2017/0309823 A1   Oct. 26, 2017

(30) Foreign Application Priority Data
May 8, 2015 (CN) .......................... 2015 1 0232793

(51) Int. Cl.
*H01L 51/00* (2006.01)
*H01L 51/56* (2006.01)
(Continued)

(52) U.S. Cl.
CPC ...... *H01L 51/0012* (2013.01); *H01L 27/3244* (2013.01); *H01L 51/001* (2013.01);
(Continued)

(58) Field of Classification Search
CPC ............ H01L 51/0012; H01L 27/3244; H01L 51/001; H01L 51/5246; H01L 51/5259; H01L 51/56; H01L 2251/558
See application file for complete search history.

(56) References Cited

U.S. PATENT DOCUMENTS 7,837,530 B2 * 11/2010 Park ................... H01L 51/5246
445/24
7,893,613 B2  2/2011 Kwak
(Continued)

FOREIGN PATENT DOCUMENTS

CN   101097942 A   1/2008
CN   101847694 A   9/2010
(Continued)

OTHER PUBLICATIONS

English translation of PCT (CN) International Search Report, Application No. PCT/CN2016/076591, dated Jun. 17, 2016, 2 pgs.
(Continued)

*Primary Examiner* — Fernando L. Toledo
*Assistant Examiner* — Neil Prasad
(74) *Attorney, Agent, or Firm* — Armstrong Teasdale LLP

(57) ABSTRACT

The present disclosure provides a display panel and a fabricating method thereof, and a display device. The fabricating method for the display panel includes forming a glass adhesive layer on a packaging region of a first substrate, forming an OLED device on a display region of the first substrate, and aligning the first substrate with a second substrate, and forming a sealing structure between the first substrate and the second substrate by irradiating the pack-
(Continued)

aging region with laser. The fabricating method for the display panel according to an embodiment of the present disclosure avoids the occurrence of the phenomenon that the coated glass adhesive layer and the evaporated organic light emitting layer are offset during the subsequent packaging process, by fabricating the glass adhesive layer on the substrate for forming the OLED device, thereby the production efficiency of the overall packaging process is enhanced.

20 Claims, 1 Drawing Sheet

(51) Int. Cl.
H01L 27/32 (2006.01)
H01L 51/52 (2006.01)
(52) U.S. Cl.
CPC ...... *H01L 51/5246* (2013.01); *H01L 51/5259* (2013.01); *H01L 51/56* (2013.01); *H01L 2251/558* (2013.01)

(56) References Cited

U.S. PATENT DOCUMENTS

| 8,405,309 | B2* | 3/2013 | Lee | H01L 51/5246 |
| | | | | 313/504 |
| 2005/0078164 | A1 | 4/2005 | Kwon et al. | |
| 2007/0173167 | A1 | 7/2007 | Choi | |
| 2007/0176550 | A1* | 8/2007 | Kwan | H01L 51/5246 |
| | | | | 313/512 |
| 2009/0322923 | A1* | 12/2009 | Maehara | H01L 27/307 |
| | | | | 348/308 |
| 2010/0089636 | A1* | 4/2010 | Ramadas | B82Y 15/00 |
| | | | | 174/521 |
| 2011/0241528 | A1 | 10/2011 | Choi | |
| 2014/0145588 | A1* | 5/2014 | Oh | H01L 51/524 |
| | | | | 313/512 |

FOREIGN PATENT DOCUMENTS

| CN | 102956675 A | 3/2013 |
| CN | 103022374 A | 4/2013 |
| CN | 103102075 A | 5/2013 |
| CN | 103367658 A | 10/2013 |
| CN | 103943647 A | 7/2014 |
| CN | 104022234 A | 9/2014 |
| CN | 104124179 A | 10/2014 |
| CN | 104218186 A | 12/2014 |
| CN | 104795433 A | 7/2015 |

OTHER PUBLICATIONS

PCT (CN) Written Opinion, Application No. PCT/CN2016/076591, dated Jun. 17, 2016, 6 pgs.: with English translation.

China First Office Action with search report, Application No. 201510232793.4, dated Dec. 3, 2015, 14 pgs.: with English translation.

* cited by examiner

DISPLAY PANEL AND FABRICATING METHOD THEREOF, AND DISPLAY DEVICE

CROSS REFERENCE TO RELATED APPLICATIONS

This application is a National Stage Entry of PCT/CN2016/076591 filed Mar. 17, 2016, which claims the benefit and priority of Chinese Patent Application No. 201510232793.4, filed on May 8, 2015, the disclosures of which are incorporated by reference herein in their entirety as part of the present application.

BACKGROUND

Exemplary embodiments of the present disclosure relate to a display panel and a fabricating method thereof, and a display device.

In recent years, organic light emitting diode (OLED) display as a new flat-panel display, has attracted wide attention. Since the OLED device itself is very sensitive to moisture and oxygen, it is necessary to package the OLED device in practice to protect it from moisture and oxygen, thereby extending the lifetime of the OLED device.

In the current OLED display fabricating process, a glass adhesive is usually used to achieve the package between a package cover and an array substrate on which organic luminescent material is evaporated. Specifically, the glass adhesive is first coated on the package cover, then subjected to a series of heat treatments to remove the solvent such as moisture from the glass adhesive, then vacuum-bonded to the array substrate on which organic luminescent material is evaporated, and sintered using laser. However, in the above process, since the organic light emitting material and the glass adhesive for package are respectively formed on two different glass substrates, when the two glass substrates are vacuum-bonded, if misalignment occurs during the bonding process, the coated glass adhesive layer and the evaporated organic luminescent layer are offset, resulting in poor packaging, thereby reducing the production efficiency of the overall packaging process.

BRIEF DESCRIPTION

The present disclosure aims to provide a display panel and a fabricating method thereof, and a display device, for solving the problem that the misalignment during the conventional OLED packaging process causes the glass adhesive layer and the vapor-deposited organic light emitting layer to offset, resulting in poor packaging.

According to a first aspect, embodiments of the present disclosure provide a fabricating method for a display panel, including forming a glass adhesive layer on a packaging region of the first substrate, forming an OLED device on a display region of the first substrate, aligning the first substrate with a second substrate, and forming a sealing structure between the first substrate and the second substrate by irradiating the packaging region with laser.

According to an embodiment of the present disclosure, the OLED device includes a first electrode layer, an organic light emitting layer, and a second electrode layer sequentially formed on the first substrate, wherein the organic light emitting layer of the OLED device is formed after forming the glass adhesive layer.

According to an embodiment of the present disclosure, the organic light emitting layer of the OLED device is formed by vacuum evaporation of an organic material.

According to an embodiment of the present disclosure, the fabricating method of the display panel further includes after forming the glass adhesive layer, and before forming the organic light emitting layer of the OLED device, subjecting the first substrate to a high temperature treatment, to remove the solvent in the glass adhesive layer. According to an embodiment of the present disclosure, the thickness of the glass adhesive layer is 3 to 8 microns.

According to an embodiment of the present disclosure, the fabricating method of the display panel further includes forming a desiccant layer on the second substrate before the aligning the first substrate with the second substrate.

According to an embodiment of the disclosure, the desiccant layer is transparent.

According to an embodiment of the present disclosure, the desiccant layer has a thickness of 50 to 100 angstroms.

According to a second aspect, embodiments of the present disclosure provide a display panel including a first substrate and a second substrate disposed opposite to each other, wherein an OLED device is provided on the first substrate, a sealing structure formed by a glass adhesive layer is provided between the first substrate and the second substrate, wherein the glass adhesive layer is formed on the first substrate.

According to an embodiment of the present disclosure, the OLED device includes a first electrode layer, an organic light emitting layer, and a second electrode layer sequentially formed on the first substrate.

According to an embodiment of the present disclosure, the thickness of the glass adhesive layer is 3 to 8 microns.

According to an embodiment of the present disclosure, a desiccant layer is further provided on the second substrate.

According to an embodiment of the disclosure, the desiccant layer is transparent.

According to an embodiment of the present disclosure, the desiccant layer has a thickness of 50 to 100 angstroms.

According to a third aspect, embodiments of the present disclosure provide a display device including the display panel according to any one of the above embodiments.

The fabricating method of a display panel according to the embodiment of the present disclosure avoids the occurrence of the phenomenon that the coated glass adhesive layer and the evaporated organic light emitting layer are offset during the subsequent packaging process, by fabricating the glass adhesive layer on the substrate for forming the OLED device, thereby enhancing the production efficiency of the overall packaging process, can avoid the poor displaying of the OLED device caused by the residue on the evaporated mask plate or the presence thereof as a particle in the display by forming the organic light emitting layer of the OLED device after the formation of the glass adhesive layer, removes the solvent in the glass adhesive layer by subjecting the substrate on which the glass adhesive layer is formed to a high temperature treatment after forming the glass adhesive layer and before forming the organic luminescent layer of the OLED device, and can prevent damage to the OLED device by moisture which is not removed from the glass adhesive by forming a desiccant layer on the package cover, thereby protecting the OLED device.

BRIEF DESCRIPTION OF THE DRAWINGS

In order to more clearly illustrate the technical solution of embodiments of the present disclosure, the drawings to be used in the description of the embodiments will be briefly introduced below. Apparently, the drawings described below are merely about some embodiments of the present disclosure, and those of ordinary skill in the art can also obtain other drawings from these drawings without creative work.

DETAILED DESCRIPTION

Figure 1:
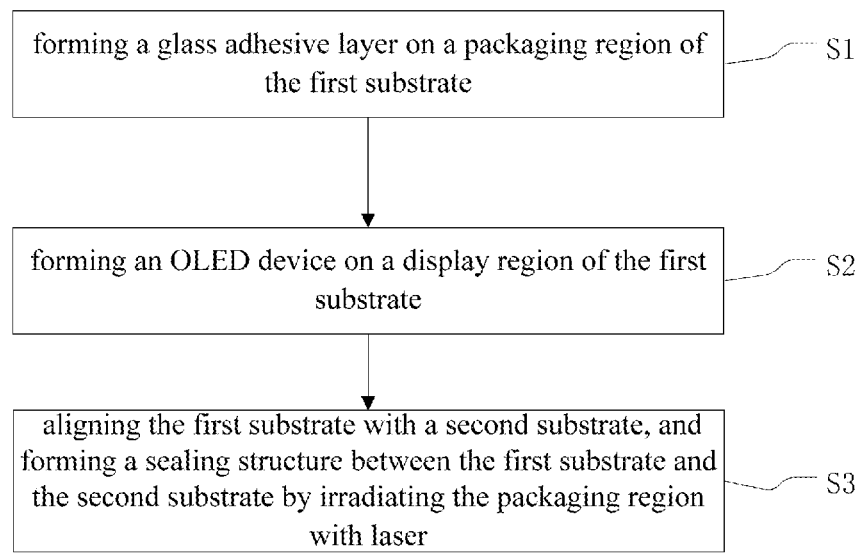
FIG. 1 is a flowchart of a fabricating method for a display panel according to an embodiment of the present disclosure.

The technical solutions in the embodiments of the present disclosure will be clearly and completely described below in conjunction with the accompanying drawings in the embodiments of the present disclosure. Obviously, the described embodiments are merely part of the embodiments of the present disclosure, rather than all the embodiments. Based on the embodiments of the present disclosure, all other embodiments obtained by those of ordinary skill in the art without the need for creative work fall within the scope of the present disclosure.

In the description of the present disclosure, it should be noted that the orientation or positional relationship indicated by the terms "upper", "lower", "top", "bottom" and the like is an orientation or positional relationship indicated based on the drawings, merely for describing the present disclosure and simplifying the description, rather than suggesting or implying that the indicated device or element must be of a particular orientation, be constructed and operated in a particular orientation, whereby it cannot be construed as limiting the present disclosure.

Furthermore, in the present disclosure, the terms "first", "second", and "third" are used for description purposes only and are not to be construed as indicating or implying relative importance. The term "a plurality of" means two or more, unless otherwise specifically limited.

A fabricating method for a display panel according to an embodiment of the present disclosure includes forming a glass adhesive layer on a packaging region of a first substrate, forming an OLED device on a display region of the first substrate, aligning the first substrate with a second substrate, and forming a sealing structure between the first substrate and the second substrate by irradiating the packaging region with laser.

The fabricating method for a display panel according to the embodiment of the present disclosure avoids the occurrence of the phenomenon that the coated glass adhesive layer and the evaporated organic light emitting layer are offset during the subsequent packaging process, by fabricating the glass adhesive layer on the substrate for forming the OLED device, thereby enhancing the production efficiency of the overall packaging process.

Wherein, the first substrate abovementioned may be a glass substrate on which a TFT (thin film transistor) is formed, and by forming an OLED device thereon, an array substrate of the OLED display panel may be obtained. The second substrate abovementioned may be a transparent glass substrate as a package cover of the OLED display panel.

Specifically, in the abovementioned display panel fabricating method, the first electrode layer, the organic light emitting layer, and the second electrode layer may be sequentially formed on the first substrate to form an OLED device, wherein the organic light emitting layer may be manufactured using the evaporation process. Specifically, organic small molecular material may be heated in the vacuum chamber to sublimate or melt and gasify into vapor, the organic material vapor formed is deposited on the display region of the first substrate through the opening of the metal mask plate, thereby forming the organic light emitting layer with a desired pattern.

However, during the above-mentioned evaporation process, the metal mask plate and the first substrate are likely to come into contact due to the action of the peripheral force, thereby causing the organic material remaining on the metal mask plate to adhere to the first substrate, and this residue may cause the poor displaying of the OLED device finally formed or the presence thereof as a particle. According to the embodiment of the present disclosure, in order to avoid the poor displaying or the presence thereof as a particle in the display caused by the metal mask plate for evaporation coming into contact with the first substrate in the evaporation process, in the display panel fabricating method, the step of forming the organic light emitting layer of the OLED device is placed after the step of forming the glass adhesive layer in the abovementioned display panel fabricating method.

Referring to FIG. 1 which is a flowchart of a fabricating method for a display panel provided by an embodiment of the present disclosure, as shown in FIG. 1, the fabricating method for a display panel includes the steps of:

S1: forming a glass adhesive layer on a packaging region of the first substrate;

S2: forming an OLED device on a display region of the first substrate; and

S3: aligning the first substrate with a second substrate, and forming a sealing structure between the first substrate and the second substrate by irradiating the packaging region with laser.

Figure 2:
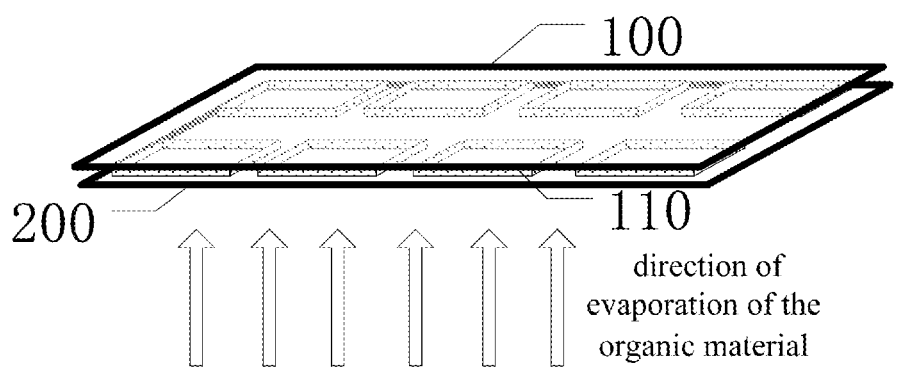
FIG. 2 is a schematic diagram of fabricating an organic light emitting layer according to an embodiment of the present disclosure.

As shown in FIG. 2, in Step S2, since the glass adhesive layer 110 has been formed on the packaging region around the first substrate 100 when producing the organic light emitting layer, the metal mask plate 200 may be effectively separated from the first substrate 100 through the glass adhesive layer 110 to prevent the direct contact of the metal mask plate 200 with the display region of the first substrate 100 and to prevent the organic material remaining on the metal mask plate from adhering to the display region of the first substrate 100, wherein the thickness of the formed glass adhesive layer may be 3 to 8 microns, and may be, for example, 5 μm or 6 μm.

Specifically, a glass adhesive may be first coated to the packaging region of the first substrate, and then the first substrate may be subjected to a high temperature treatment to remove a solvent such as moisture from the glass adhesive, and then an organic light emitting layer of the OLED device may be formed thereon, which, after the fabricating of other structures is finished to obtain the array substrate, is bonded to the second substrate. Thereafter, the glass adhesive is irradiated with laser to form a sealing structure between the first substrate and the second substrate.

According to an embodiment of the present disclosure, in order to avoid the incomplete removal of the solvent in the glass adhesive and the resulting adverse effect on the OLED device, in the abovementioned packaging process, before aligning the first substrate with the second substrate, the process further includes forming a desiccant layer on the second substrate, wherein the desiccant layer may have a thickness of 50 to 100 angstroms, for example, 60 angstroms, 80 angstroms, or the like. Specifically, a transparent desiccant layer may be formed by coating a transparent desiccant material on the surface to which the second substrate is bonded to the first substrate. Alternatively, a drying film-shaped structure may be directly used and directly attached to the surface of the second substrate. With the abovementioned method, it is possible to prevent damage to the OLED device by a solvent such as moisture, which is not removed from the glass adhesive, and thereby protecting the OLED device.

In addition, according to an embodiment of the present disclosure, there is also provided a display panel including a first substrate and a second substrate disposed opposite to each other, wherein an OLED device is provided on the first substrate, and a sealing structure formed by a glass adhesive layer is provided between the first substrate and the second substrate, wherein the glass adhesive layer is fabricated on the first substrate.

According to an embodiment of the present disclosure, the thickness of the glass adhesive layer is 3 μm to 8 μm.

According to an embodiment of the present disclosure, the damage to the OLED device by a solvent such as moisture which is not removed from the glass adhesive is prevented, and the second substrate is further provided with a desiccant layer, wherein the desiccant layer has a thickness of 50 to 100 angstroms, for example, 60 angstroms, 80 angstroms and the like.

Further, according to an embodiment of the present disclosure, there is also provided a display device including the abovementioned display panel.

The display device according to the embodiment of the present disclosure may be any product or component having a display function such as a notebook computer display screen, a television, a digital photo frame, a mobile phone, a tablet computer or the like.

The above embodiments are merely illustrative of the present disclosure and are not to be construed as limitations of the present disclosure, and those of ordinary skill in the art may also make various changes and modifications without departing from the spirit and scope of the present disclosure. Therefore, all the equivalent technical solutions also fall within the scope of the disclosure, which shall be defined by the claims.

What is claimed is:

1. A fabricating method for a display panel, comprising:
   forming a glass adhesive layer on a packaging region of a first substrate;
   forming an OLED device comprising an organic light emitting layer on a display region of the first substrate, wherein the organic light emitting layer of the OLED device is formed after forming the glass adhesive layer;
   aligning the first substrate with a second substrate; and
   forming a sealing structure between the first substrate and the second substrate by irradiating the packaging region with a laser.

2. The fabricating method for a display panel according to claim 1, wherein the OLED device includes a first electrode layer and a second electrode layer, wherein the first electrode layer, the organic light emitting layer, and the second electrode layer are sequentially formed on the first substrate.

3. The fabricating method for a display panel according to claim 2, wherein the organic light emitting layer of the OLED device is formed by vacuum evaporation of an organic material.

4. The fabricating method for a display panel according to claim 2, further comprising, after forming the glass adhesive layer, and before forming the organic light emitting layer of the OLED device, subjecting the first substrate to a high temperature treatment to remove the solvent in the glass adhesive layer.

5. The fabricating method for a display panel according to claim 1, wherein the thickness of the glass adhesive layer is in a range from 3 to 8 microns.

6. The fabricating method for a display panel according to claim 1, further comprising forming a desiccant layer on the second substrate before aligning the first substrate with the second substrate.

7. The fabricating method for a display panel according to claim 6, wherein the desiccant layer is transparent.

8. The fabricating method for a display panel according to claim 6, wherein the desiccant layer has a thickness in a range from 50 to 100 angstroms.

9. A display panel fabricated by the method according to claim 1.

10. The display panel according to claim 9, wherein the OLED device comprises a first electrode layer, an organic light emitting layer, and a second electrode layer sequentially formed on the first substrate.

11. The display panel according to claim 9, wherein the thickness of the glass adhesive layer is in a range from 3 to 8 microns.

12. The display panel according to claim 9, wherein a desiccant layer is further provided on the second substrate.

13. The display panel according to claim 12, wherein the desiccant layer is transparent.

14. The display panel according to claim 12, wherein the desiccant layer has a thickness in a range from 50 to 100 angstroms.

15. A display device comprising the display panel according to claim 9.

16. A display device comprising the display panel according to claim 10.

17. A display device comprising the display panel according to claim 11.

18. A display device comprising the display panel according to claim 12.

19. A display device comprising the display panel according to claim 13.

20. A display device comprising the display panel according to claim 14.

* * * * *

UNITED STATES PATENT AND TRADEMARK OFFICE
CERTIFICATE OF CORRECTION

PATENT NO. : 10,199,576 B2
APPLICATION NO. : 15/511288
DATED : February 5, 2019
INVENTOR(S) : Fashun Li et al.

Page 1 of 1

It is certified that error appears in the above-identified patent and that said Letters Patent is hereby corrected as shown below:

In the Claims

In Claim 1, Column 5, Line 46, delete "glass adhesive layer," and insert therefor -- glass adhesive layer; --.

Signed and Sealed this
Second Day of July, 2019

Andrei Iancu
*Director of the United States Patent and Trademark Office*